United States Patent
Han et al.

(10) Patent No.: US 8,717,022 B2
(45) Date of Patent: May 6, 2014

(54) MAGNETIC FIELD GRADIENT MONITOR APPARATUS AND METHOD

(75) Inventors: Hui Han, Fredericton (CA); Bruce Balcom, Fredericton (CA)

(73) Assignee: University of New Brunswick, Fredericton, New Brunswick (CA)

( * ) Notice: Subject to any disclaimer, the term of this patent is extended or adjusted under 35 U.S.C. 154(b) by 288 days.

(21) Appl. No.: 13/003,509

(22) PCT Filed: Jul. 8, 2009

(86) PCT No.: PCT/CA2009/000944
§ 371 (c)(1),
(2), (4) Date: Mar. 29, 2011

(87) PCT Pub. No.: WO2010/003237
PCT Pub. Date: Jan. 14, 2010

(65) Prior Publication Data
US 2011/0181284 A1    Jul. 28, 2011

Related U.S. Application Data

(60) Provisional application No. 61/079,102, filed on Jul. 8, 2008.

(51) Int. Cl.
*G01V 3/00* (2006.01)
(52) U.S. Cl.
USPC .......................................... 324/309; 324/322
(58) Field of Classification Search
USPC .................... 324/300–322; 600/407–445
See application file for complete search history.

(56) References Cited

U.S. PATENT DOCUMENTS

| | | | |
|---|---|---|---|
| 4,920,316 | A | 4/1990 | Egloff |
| 5,023,551 | A | 6/1991 | Kleinberg et al. |
| 5,574,370 | A | 11/1996 | Woelk et al. |
| 6,462,542 | B1 | 10/2002 | Venkataramanan et al. |
| 6,507,191 | B1 | 1/2003 | Eguchi et al. |
| 6,883,702 | B2 | 4/2005 | Hurlimann et al. |

(Continued)

FOREIGN PATENT DOCUMENTS

| | | |
|---|---|---|
| CA | 2600990 A1 | 3/2009 |
| WO | 2010003237 A1 | 1/2010 |

OTHER PUBLICATIONS

Deka, K. et al., "Quantitative density profiling with pure phase encoding and a dedicated 1D gradient", Journal of Magnetic Resonance, vol. 178, 2006 pp. 25-32, Available on-line Sep. 26, 2005.

(Continued)

*Primary Examiner* — Brij Shrivastav
(74) *Attorney, Agent, or Firm* — Eugene F. Derényi; Fogler, Rubinoff LLP (57) ABSTRACT

A method based on pure phase encode FIDs that permits high strength gradient measurement is disclosed. A small doped water phantom (1~3 mm droplet, $T_1$, $T_2$, $T_2^*$<100 µs) within a microprobe is excited by a series of closely spaced broadband RF pulses each followed by single FID point acquisition. Two trial gradient waveforms illustrate the technique, neither of which could be measured by the conventional microprobe measurement. The first is an extended duration gradient waveform while the other illustrates this method's ability to measure gradient waveforms with large net area and/or high amplitude. This method is a point monitor with simple implementation and low cost hardware requirements.

14 Claims, 5 Drawing Sheets

(56) References Cited

U.S. PATENT DOCUMENTS

| | | | |
|---|---|---|---|
| 6,971,260 B2 | 12/2005 | Potter | |
| 7,034,528 B2 | 4/2006 | Minh et al. | |
| 7,138,802 B2 | 11/2006 | Morita et al. | |
| 7,352,179 B2 | 4/2008 | Chen et al. | |
| 7,388,374 B2 | 6/2008 | Minh et al. | |
| 2007/0038076 A1 | 2/2007 | Osada et al. | |
| 2009/0082662 A1* | 3/2009 | Israel | 600/421 |
| 2009/0256562 A1 | 10/2009 | Gao et al. | |
| 2011/0050223 A1 | 3/2011 | Balcom et al. | |
| 2011/0204892 A1 | 8/2011 | Li et al. | |
| 2012/0229137 A1* | 9/2012 | Ulzega et al. | 324/309 |

OTHER PUBLICATIONS

Goodyear, D. J. et al., Single point measurements of magnetic field gradient waveform, Journal of Magnetic Resonance, vol. 163, 2003, pp. 1-7.

Andris, P. et al., "Magnetic field of RF coil measurement by NMR method", Measurement Science Review, vol. 1, No. 1, 2001, pp. 13-16.

Kennedy, C. B. et al., "Three-dimensional magnetic resonance imaging of rigid polymeric materials using single-point ramped imaging with T1 enhancement (SPRITE)", Can J. Chem, vol. 76, 1998, pp. 1753-1765.

Latta, P. et al., "Single-point imaging with a variable phase encoding interval", Magnetic Resonance Imaging, vol. 26, 2008, pp. 109-116.

ISA/CA. Written Opinion of the International Searching Authority Oct. 7, 2009.

Walter Block, et al., Consistent Fat Suppression with Compensated Spectral-Spatial Pulses, Magn. Reson. Med. 38(2): 198-206, Aug. 1997.

John C. Haselgrove, James R. Moore, Correction for Distortion of Echo-Planar Images Used to Calculate the Apparent Diffusion Coefficient, Magn. Reson. Med. 36(6): 960-964, Dec. 1996.

Anila Lingamneni, et al., Validation of Cine Phase-Contrast MR Imaging for Motion Analysis, J. Magn. Reson. Imaging 5(3): 331-338, May/Jun. 1995.

Graeme F. Mason, et al., A Method to Measure Arbitrary k-Space trajectories for Rapid MR Imaging, Magn. Reson. Med. 38(3), 492-496, Sep. 1997.

Yantian Zhang, et al., A Novel k-Space Trajectory Measurement Technique, Magn. Reson. Med. 39(6): 999-1004, Jun. 1998.

Jeff H. Duyn, et al., Simple Correction Method for k-Space Trajectory Deviations in MRI, J. Magn. Reson. 132(1): 150-153. May 1998.

Dong-Hyun Kim, Daniel M. Spielman, Reducing Gradient Imperfections for Spiral Magnetic Resonance Spectroscopic Imaging, Magn. Reson. Med. 56(1): 198-203, Jul. 2006.

Peter Latta, et al., Simple Phase Method for Measurement of Magnetic Field Gradient Waveforms, Magn. Reson. Imaging 25(9): 1272-1276, Nov. 2007.

Vladimir Jellus, et al., An NMR Technique for Measurement of Magnetic Field Gradient Waveforms, J. Magn. Reson. 162(1): 189-197, May 2003.

Atsushi Takahashi, Terry Peters, Compensation of Multi-Dimensional Selective Excitation Pulses Using Measured k-Space Trajectories, Magn. Reson. Med. 34(3): 446-456, Sep. 1995.

Marcus T. Alley, et al., Gradient Characterization Using a Fourier-Transform Technique, Magn. Reson. Med. 39 (4): 581-587, Apr. 1998.

Nikolaos G. Papadakis, et al., A General Method for Measurement of the Time Integral of Variant Magnetic Field Gradients: Application to 2D Spiral Imaging, Magn. Reson. Imaging 15(5): 567-578 (1997).

Nicola De Zanche, et al., NMR Probes for Measuring Magnetic Fields and Field Dynamics in MR Systems, Magn. Reson. Med. 60(1): 176-186, Jul. 2008.

Christoph Barmet, et al., Spatiotemporal Magnetic Field Monitoring for MR, Magn. Reson. Med. 60(1): 187-197, Jul. 2008.

D. I. Hoult, R. E. Richards, The Signal-to-Noise Ratio of the Nuclear Magnetic Resonance Experiment, J. Magn. Reson. 213(2): 329-343, Dec. 2011.

D. I. Hoult, The Principle of Reciprocity in Signal Strength Calculations—A Mathematical Guide, Concepts. Magn. Reson. 12(4): 173-187, Jun. 2000.

Timothy L. Peck, et al., Design and Analysis of Microcoils for NMR Microscopy, J. Magn. Reson. B 108(2): 114-124, Aug. 1998.

Meghan Halse, et al., Centric Scan SPRITE Magnetic Resonance Imaging, J. Magn. Reson. 165(2): 219-229, Dec. 2003.

Peter Jezzard, et al., Characterization of and Correction for Eddy Current Artifacts in Echo Planar Diffusion Imaging, Magn. Reson. Med. 39(5): 801-812, May 1998.

T. G. Reese, et al., Reduction of Eddy-Current-Induced Distortion in Diffusion MRI Using a Twice-Refocused Spin Echo, Magn. Reson. Med. 49(1): 177-182, Jan. 2003.

Bernstein, M. A., King, K. F., & Zhou, X. J. (2004). Handbook of MRI Pulse Sequences. N.p.: Elsevier Inc. (cover page and table of contents).

Schmitt, F., Stehling, M. K., & Turner, R. J. (1998). Echo-Planar Imaging. N.p.: Springer-Verlag GmbH. (cover page and table of contents).

Mispelter, J., Lupu, M., & Briguet, A. (2006). NMR Probeheads for Biophysical and Biomedical Experiments. N.p.: Imperial College Press. (cover page and table of contents).

T. Onodera, et al., A method of measuring field-gradient modulation shapes. Application to high speed NMR spectroscopic imaging. J. Phys. E: Sci. Instum. 20: 416-419, (1987).

K. P. Pruessmann, et al., Magnetic Field Monitoring during MRI Acquisition Improves Image Reconstruction, in "proc., ISMRM, 13th Annual Meeting", 681 (2005).

N. De Zanche, et al., Advances in NMR Probe Technology for Magnetic Field Monitoring, in "proc., ISMRM, 14th Annual Meeting", (2006) 781.

F. Wiesinger, et al., Magnetic Field Monitoring for Improved Phase Contrast Flow Quantification, in "proc., ISMRM, 16th Annual Meeting", (2008) 392.

F. Wiesinger, et al., Magnetic Field Monitored Autofocus Deblurring for Improved Non-Cartesian Imaging, in "proc., ISMRM, 16th Annual Meeting", (2008) 790.

J. Jonas and A. Jonas, "High-Pressure NMR Spectroscopy of Proteins and Membranes", Annu. Rev. Biophys. Biomol. Struct. 1994, 23: 287-318.

Jiri Jonas, "High-Pressure NMR Studies of Chemical and Biochemical Systems", High Pressure Chemistry, Biochemistry and Materials Science, 1993, vol. 401: 393-441, 1993 Kluwer Academic Publishers, Netherlands.

Jiri Jonas, "Nuclear Magnetic Resonance at High Pressure", Science, Jun. 11, 1982, vol. 216, No. 4551, 1179-1184.

Sprengers et al, "High-Pressure NMR Spectroscopy: Some General Aspects and Applications", High Pressure Effects in Chemistry, Biology, and Materials Science, 2002, vol. 208-2, pp. 283-294, Scitec Publications Ltd., Zurich.

Grunwaldt et al, "Supercritical Fluids in Catalysis: Opportunities of In Situ Spectroscopic Studies and Monitoring Phase Behavior", Catalysis Reviews, 2003, vol. 45, No. 1, pp. 1-96.

Behr et al, "High-pressure autoclave for multipurpose nuclear magnetic resonance measurements up to 10 MPa", Review of Scientific Instruments, vol. 70, No. 5, May 1999, pp. 2448-2453.

S. Gaemers and C. J. Elsevier, "Reducing the NMR line widths of quadrupole nuclei by employing supercritical solvents", Chem. Soc. Rev., 1999, 28, 135-141.

Istvan T. Horvath and John M. Miuar, "NMR under High Gas Pressure", Chem. Rev. 1991. 91. 1339-1351.

Yamada et al, "Pressure-resisting cell for high-pressure, high-resolution nuclear magnetic resonance measurements at very high magnetic fields", Rev. Sci. Instrum., vol. 72, No. 2, Feb. 2001, pp. 1463-1471.

Kremer et al, "The use of high-sensitivity sapphire cells in high pressure NMR spectroscopy and its application to proteins", Spectroscopy 18 (2004) 271-278, IOS Press.

Thurecht et al, "Equilibrium Swelling Measurements of Network and Semicrystalline Polymers in Supercritical Carbon Dioxide Using High-Pressure NMR", Macromolecules 2005, 38, 3731-3737.

Stevens et al, "Measurements of Hydrate Formations in Sandstone", Petrophysics 2008, vol. 49, No. 1, pp. 67-73.

(56) References Cited

OTHER PUBLICATIONS

Baldwin et al, "Monitoring hydrate formation and dissociation in sandstone and bulk with magnetic resonance imaging", Magnetic Resonance Imaging 21 (2003) 1061-1069.

Jonas et al, "High-Resolution NMR Spectroscopy at High Pressures", Journal of Magnetic Resonance, Series B, 102, 299-309 (1993).

Morris et al, "Robust spatially resolved pressure measurements using MRI with novel buoyant advection-free preparations of stable microbubbles in polysaccharide gels", Journal of Magnetic Resonance 193 (2008) 159-167.

Baldwin et al, "Using magnetic resonance imaging to monitor CH4 hydrate formation and spontaneous conversion of CH4 hydrate to CO2 hydrate in porous media", Magnetic Resonance Imaging 27 (2009) 720-726.

Hirai et al, "Technical Note—High-pressure magnetic resonance imaging up to 40 MPa", Magnetic Resonance Imaging 18 (2000) 221-225.

Tsushima et al, "Velocity measurement of clay intrusion through a sudden contraction step using a tagging pulse sequence", Magnetic Resonance Imaging 21 (2003) 673-677.

USPTO Office Action dated Feb. 16, 2012.
USPTO Office Action dated Oct. 26, 2012.

* cited by examiner

MAGNETIC FIELD GRADIENT MONITOR APPARATUS AND METHOD

FIELD OF THE INVENTION

The present invention relates to magnetic resonance imaging generally, and pure phase encode magnetic field gradient monitoring in particular.

BACKGROUND OF THE INVENTION

Magnetic field gradients play a central role in MR imaging. Their functions include encoding spatial information and sensitizing the image contrast to coherent or incoherent motion. Fast, efficient MRI measurements rely on magnetic field gradient waveforms with high temporal fidelity.

Rapid switching of the magnetic field gradients leads to rapidly changing magnetic flux through the rf coil, rf shield, main magnet components and other structures. This changing magnetic flux leads to eddy currents being induced in conducting pathways near the magnet bore. Hardware improvements such as shielded gradient coils and waveform pre-emphasis are largely successful at reducing these effects in modern scanners. The residual eddy currents may however still cause image-quality problems [1] including ghosting in EPI, RARE and GRASE imaging pulse sequences [2], slice-profile modulation with spatial-spectral RF pulses [3], geometric distortion in diffusion-weighted EPI [4], and quantitative velocity errors in phase-contrast imaging [5]. Knowledge of the true gradient waveform in the MRI pulse sequence is critical to addressing and remedying such problems.

Numerous methods have been developed to measure MRI gradient waveforms and k-space trajectories [6-14]. One strategy is magnetic field monitoring with RF microprobes (MFM) [15-16]. Multiple RF microprobes record the magnetic field evolution associated with a wide variety of imaging pulse sequences.

The MFM method involves exciting the sample and measuring the time evolution of magnetization through the FID. However, the gradient waveform duration is limited by the sample $T_2^*$. The k-space maxima (i.e. maximum temporal gradient area or image resolution) measurable with MFM are also limited by gradient dephasing. In addition, implementation of this technique is relatively complex as it requires careful probe fabrication, an array of at least 3 probes, accurate probe positioning and alignment and a multi channel receiver.

SUMMARY OF THE INVENTION

The method of this invention is a pure phase encode version of the MFM measurement for mapping magnetic field gradient waveforms. This method involves a heavily doped small water droplet (diameter ≤1~3 mm) within a micro RF coil excited by a series of closely spaced broadband RF pulses each followed by single FID point acquisition.

Compared with the prior art frequency encode magnetic field monitoring (MFM) with NMR microprobes, pure phase encode detection with RF microprobes has distinct advantages: (i) there is no $T_2^*$ decay limitation on the waveform measurement and thus measurements of long duration gradient waveforms are possible; (ii) gradient dephasing is avoided by decomposing the large gradient area into small separate gradient areas with short time interval $t_p$ and thus there is no limit on the k-space maxima or net gradient area maxima; (iii) it allows measurement of high amplitude gradients for imaging and diffusion; and (iv) simple probe construction is possible since susceptibility matching probe components are not required.

One aspect of this invention is a method of measuring a magnetic field gradient within a local area of a magnetic field gradient in an NMR sample space comprising the steps of providing a reference sample in the local area, providing a probe suitable for holding the reference sample, exciting the reference sample by a broad band RF pulse, acquiring a free induction decay (FID) signal from the reference sample, and recording the magnetic field gradient amplitude in the FID after a fixed phase encode interval after the RF pulse. The RF pulse can also be a series of pulses and a single FID point or cluster of individual FID points may be acquired after each RF pulse, as the underlying magnetic field gradient changes in time. The reference sample may comprise water doped with an MR contrast agent such as gadolinium chloride (GdCl3). The probe may be a single turn solenoid or multiple turn solenoid.

In another aspect, this invention teaches the use of single point pure phase encode gradient waveform measurement for a local measurement in an NMR sample space.

Yet another aspect of this invention is a method of measuring a gradient waveform in an NMR sample space, comprising the steps of providing a reference sample in the sample space, applying a series of RF pulses, providing a gradient pulse, and acquiring a single FID point after a phase encoding time. To measure the full gradient waveform, the method can be repeated. The RF pulses can be low flip angle RF pulses that provide a reference phase prior to the gradient pulse.

In another aspect, this invention discloses a probe for measuring a magnetic field gradient within a local area of a magnetic field gradient in an NMR sample space comprising a probe formed as a solenoid for containing a reference sample.

DETAILED DESCRIPTION OF THE PREFERRED EMBODIMENTS

Two trial gradient waveforms illustrate the advantages of the method of this invention. Neither could be measured by conventional MFM. One illustrates the ability to measure extended duration magnetic field gradient waveforms while the other illustrates the ability to measure magnetic field gradient waveforms with large net gradient area and/or high amplitude (a simple bipolar diffusion gradient waveform, $G_{max}$=250 mT/m, b value approx=100,000 s/mm²).

The RF micro coil utilized is extremely easy to fabricate, compared with MFM RF microprobes [15-16]. Susceptibility matching for improved static field homogeneity is not an issue. One small probe is sufficient to measure all three gradient axes and a multi channel receiver is not a prerequisite. The method is a point monitor where the probe location does not need to be exactly known.

The RF micro coil utilized provides a high measurement sensitivity compared to prior art [17] due to the maximized probe filling factor and a stronger $B_1$ field per current unit [18-19]. Prior art studies have employed a thin uniform cylindrical gel sample. It is however hard to make a thin slice phantom (thickness <3 mm) and position it orthogonal to 3 gradient directions sequentially. The method of this invention does not require phantom movement for 3 dimensional gradient measurements. The method of this invention is a point monitor with simple implementation, low cost hardware requirement but sensitive calibration.

Small NMR Probe for Gradient Monitor

For magnetic field gradient measurements, transverse magnetization phasing due to the gradient is always an issue. Smaller samples are usually required to limit signal decay due to gradient dephasing. This naturally suggests a correspondingly small RF probe. The method of this invention acquires a single FID point after a short phage encoding time $t_p$ following each RF excitation. In another embodiment, a few FID points can be acquired. Therefore it has a significant advantage against gradient dephasing compared with conventional MFM. Although a true microcoil will work efficiently with this strategy, a small NMR coil (phantom size from mm to a few cm) with simple fabrication is generally suitable.

Pure Phase Encode

Figure 2:
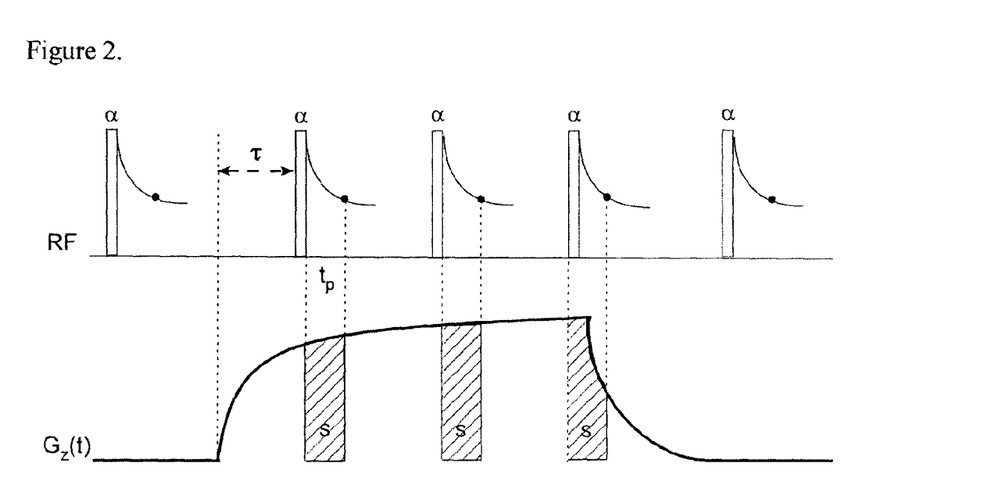
FIG. 2 is a schematic diagram showing a pulse sequence.

The waveform measurement pulse sequence is illustrated in FIG. 2. A series of broadband RF pulses are employed in each execution of the pulse sequence to create transverse magnetization in the presence of the gradient. RF pulses prior to the gradient pulse provide a reference phase. A sample with very short $T_1$, $T_2$ ensures each RF excitation is independent of all other excitations i.e. the sample magnetization will be at equilibrium for each pulse. Following each RF excitation after a fixed duration phase encoding time $t_p$, a single FID point is acquired. Gradient area S can be used to determine the phase for each measurement. With each repetition of this basic measurement sequence, following necessary signal averaging, the time variable $\tau$ is incremented. The gradient waveform can thus be measured with high temporal resolution. Multi FID point detection will also improve the temporal resolution.

With a spherical sample positioned parallel to the axis of magnetic field gradient $G_z$ with an offset $z_0$ relative to the gradient origin, the single point phase is $$\theta = \gamma G_z t_p z_0. \quad (1)$$

The signal phase is thus a direct measurement of average gradient amplitude $G_z$ during the chosen measurement interval $t_p$.

The analytical 1D Fourier Transformation of a sphere gives the magnitude of the single point:

$$|S_{(k)}| = 2\pi a^3 Sinc(2\pi ka) + \left(\frac{1}{2\pi^2 k^3} - \frac{a^2}{k}\right) Sin(2\pi ka) - a\pi ka^2 Cos(2\pi ka) \quad (2)$$

where k is $\gamma/2\pi G_z t_p$ and a is the radius of sphere. Eq. (2) is a Sinc like function with the first zero crossing at k=0.72/a.

For conventional MFM based on frequency encoding, the highest k is limited by Eq. (2). For a sphere, k must be smaller than 0.72/a to avoid gradient dephasing. Spatial resolution in a common 2D Cartesian k-space image is thus limited to a/1.01 [16]. High k-space values correspond to large net gradient areas by definition.

$$k = \frac{\gamma}{2\pi} \int_0^\tau G(t') dt'.$$

For the new method with pure phase encoding, the gradient waveform is measured by decomposing the large gradient area into small separate gradient areas with a short duration $t_p$. Thus for the same sample geometry, the new method can readily measure two orders of magnitude higher k-space compared to conventional MFM. For the same reason the new method can measure gradient amplitudes more than two orders of magnitude greater than for MFM.

Small NMR Probe and Nature of the Sample

Conventional MFM [15-16] involves exciting the test sample and measuring the time evolution of magnetization through the FID. The duration of the gradient waveform is thus limited by sample $T_2^*$ (i.e. static field inhomogeneity). The limit can be alleviated by fabricating a complex probe with susceptibility matched materials.

The pure phase encode method of this invention measures the gradient waveform through measuring discrete gradient areas. Preferably, a sample with a short $T_2$ (100 μs) is chosen. The sample $T_2^*$ is dominated by the short $T_2$ and thus the probe fabrication is simple and does not require susceptibility matching.

For the pure phase encode gradient monitor, the probe does not have to be micro scale. A larger NMR coil (phantom size from mm up to a few cm) with simple fabrication is adequate for measuring a wide range of gradient amplitudes.

Figure 1:
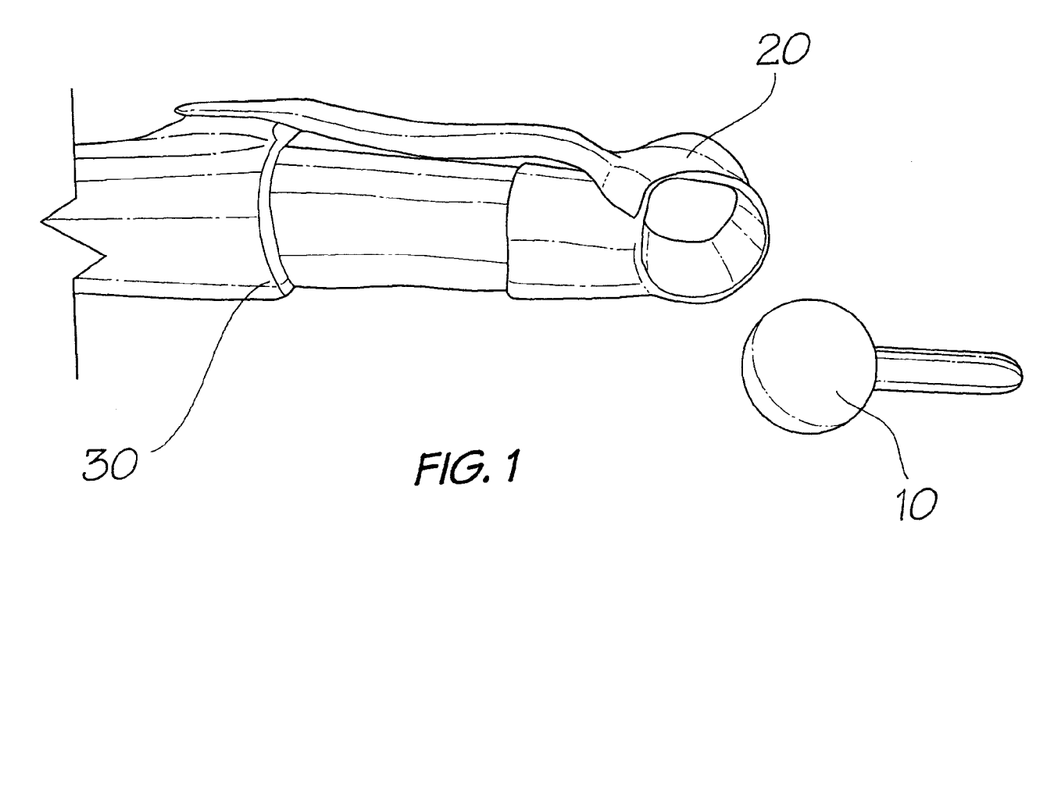
FIG. 1 is a photograph of a single turn solenoid coil probe.

In one embodiment shown in FIG. 1, a single turn solenoidal coil is used [20]. The probe can be any vessel suitable for holding a reference (phantom) sample for NMR measurement such as doped water that yields an experimental signal. The RF probehead 20 shown is a single turn solenoid, with cylindrical copper conductor, that is electrically connected to a coaxial cable 30. The embodiment shown in FIG. 1 includes a bulb 10 for containing doped water. A heavily $GdCl_3$ doped water drop ($T_2^*$, $T_2$, $T_1$s=60~100 μs) was syringed into the bulb 10 and flame sealed. It will be understood by those skilled in the art that the doping agent can be any number of paramagnetic metals which function as strong MR contrast agents. The probe was tuned to 100 MHz and capacitively matched with a Q value of 100. The probe was enclosed in an RF shield for measurement. Preferably, the probe is constructed from teflon and copper and has negligible background signal.

Another probe that can be used is described in the paper of De Zanche et al. "NMR Probes for Measuring Magnetic Fields and Field Dynamics in. MR Systems", Magnetic Resonance in Medicine 60:176-1860 (2008) but it should be understood that magnetic susceptibility matched components need not be used in the probes of the present invention.

It will be understood by those skilled in the art that the probes and methods of the present invention are used with conventional NMR apparatus such as described in this application in the examples.

The methods of the present invention enable measurement of the true magnetic field gradient waveform of the sample space (including any eddy currents or other distortions present). NMR measurements on the sample can then be corrected using suitable hardware or software to yield improved results.

The larger size sample permits the SNR of the RF receiver coil to be increased significantly since the overall signal is directly proportional to the sample volume [18, 21]. A short sample $T_1$ (100 μs) allows the monitoring probe to continuously pulse during the imaging pulse sequence.

The small size of the test sample and associated RF probe permits the gradient waveform and non-ideal behavior to be spatially resolved inside the MRI sample space, inside the MRI RF probe by simple translation of the point sensor. There is an additional benefit associated with the small RF probe point sensor approach. The gradient waveform measurement should be undertaken in the presence of the MRI RF probe since in many instances the MRI RF probe will support eddy currents. Prior art method [17] employed the MRI RF probe for the waveform measurement but this method is vulnerable to background short $T_2^*$ signals from the probe body. The pure phase approach with a dedicated small RF probe avoids the background signal problem since it is relatively easy to eliminate all short $T_2^*$ signal components from the home built probe.

The Conical SPRITE Gradient Waveform Measurement

Conical SPRITE [22] is a 3D, pure phase encode, Single Point Ramped Imaging with $T_1$-Enhancement (SPRITE) MRI method for studies of short relaxation time systems. Conical SPRITE samples k-space with a system of modified Archimedean spiral trajectories mapped to conical surfaces.

Figure 3:
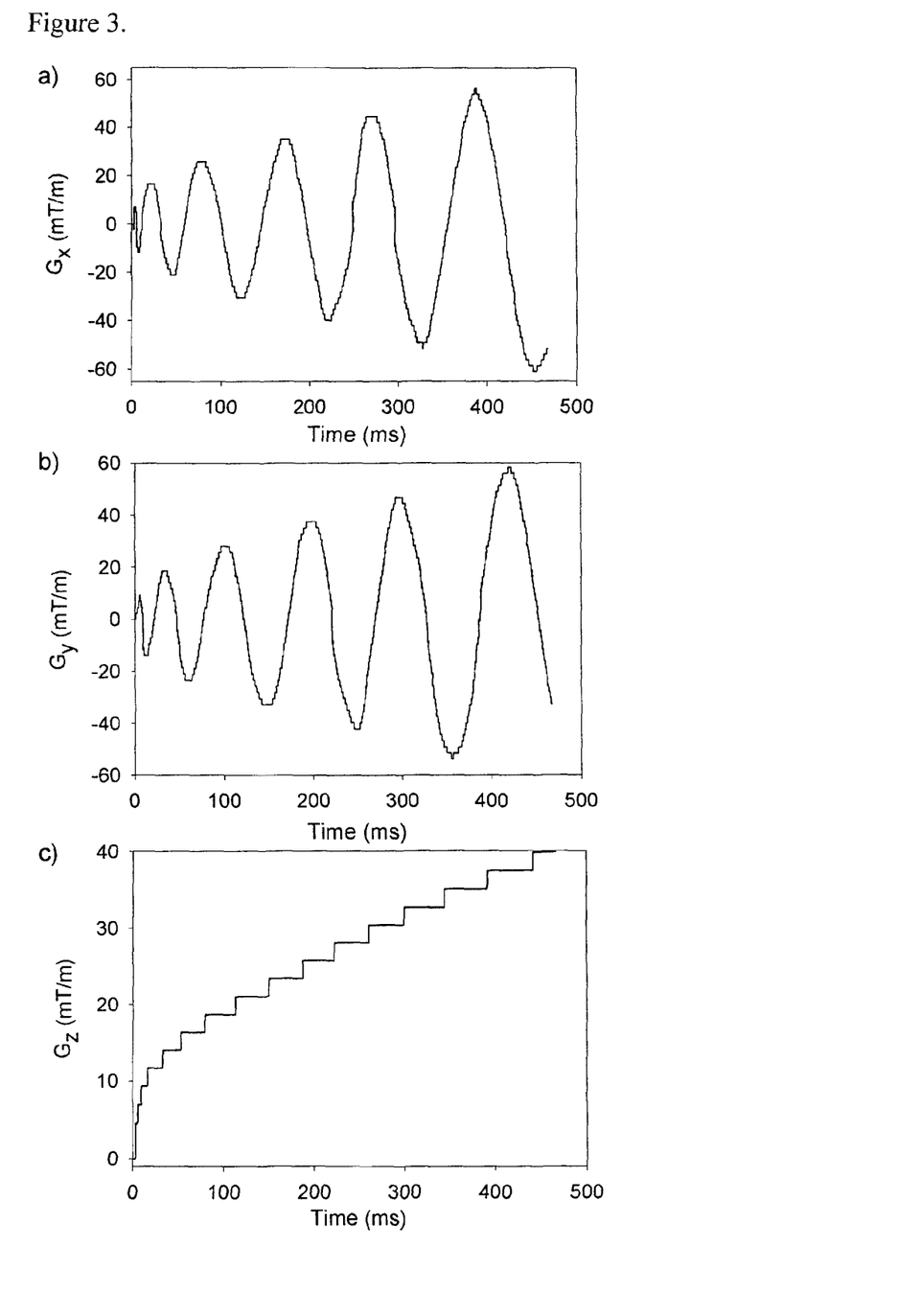
FIGS. 3(a), 3(b) and 3(c) are graphs showing measured magnetic field gradient waveforms associated with a single conical SPRITE trajectory.
Figure 4:
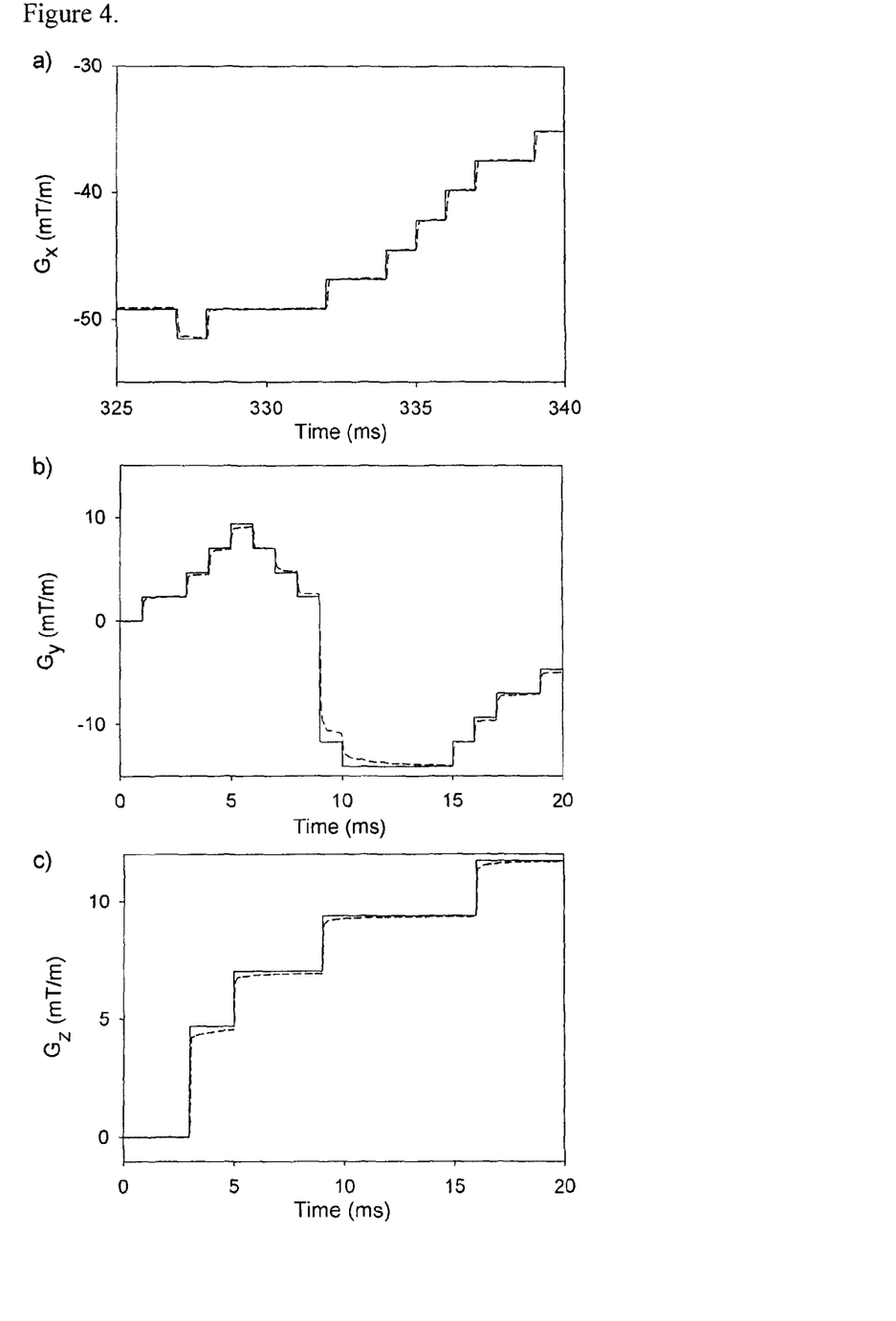
FIGS. 4(a), 4(b) and 4(c) are graphs showing expanded portions of the gradient waveforms of FIG. 3.

FIGS. 3 and 4 show the 3D gradient waveforms of a single interleave conical SPRITE k-space trajectory. The x and y gradients vary sinusoidally, while the z gradient is a stepped linear ramp. The trajectory in conical SPRITE is different from that used in frequency encoding MRI. The gradient amplitudes of each step are calculated to ensure the acquired k-space data points fall on cartesian grid points.

The gradient waveform duration in conical SPRITE varies from hundreds of milliseconds up to seconds. With conventional MFM [15-16], the transverse magnetization will completely dephase after a long duration due to the $T_2^*$ decay. The phase will become uncertain due to a low SNR, thus a long duration gradient waveform is not measurable. However for the pure phase encode measurement the duration of the gradient waveform can be infinitely long.

Three axis gradient waveforms, FIGS. 3 and 4, were measured with the probehead positioned at approximate x, y, z offsets of 20 mm, 18 mm, 30 mm from the gradient isocenter. FIG. 3 shows the measured waveforms plotted simultaneously with the input waveforms. The x and y gradients vary sinusoidally, while the z gradient is a stepped linear ramp. The y direction gradient has a slower rise time compared with the x direction gradient. There are appreciable mismatches of some gradient steps between the measured and the ideal y direction waveforms which will cause k-space misregistration in image reconstruction. The trajectory in conical SPRITE is different from that used in frequency encoding MRI. Note in particular the discrete nature of the waveform. The ideal input waveforms (-) and measured output waveforms (- - -) for $G_x$, $G_y$, and $G_z$ are essentially overlapped in these figures. The time resolution of the measurement is 10 μs with 47,600 experimental data points displayed.

In FIG. 4($a$), gradient $G_x$ matches the ideal waveform quite well in the time window 325-340 ms. In FIG. 4($b$), gradient $G_y$ is significantly in error in the time window 0-20 ms. In FIG. 4($c$), the $G_z$ gradient deviates from the ideal in the vicinity of large gradient changes in the time window 0-20 ms. The waveform temporal resolution was 10 μs per point with 15,000 data points displayed for x, and 20,000 data points for y and z respectively.

Diffusion Gradient Waveform Measurement

For most diffusion imaging sequences (e.g., diffusion weighted EPI), the diffusion sensitization b value is on the order of 1000 s/mm². The diffusion sensitizing gradients employed are usually the maximal gradient strength which can be provided by the MRI scanner. However large gradient switching will induce eddy currents even in MRI systems with good eddy current compensation. The eddy currents may cause various artifacts (e.g., geometric distortion) in diffusion weighted images [23-24].

It is preferable to measure the diffusion gradient waveforms associated with the diffusion-weighted imaging sequence for post acquisition image processing or pre-adjusting the gradient waveform to eliminate the eddy current effects. For conventional MFM [15-16], the net gradient area (i.e. the k value) that can be measured is limited by gradient dephasing. For example, a sphere sample with diameter 1 mm has the maximum k value limited to 1.44 mm$^{-1}$ and the net gradient area is limited to 34 ms·mT/m. However the net gradient area in a diffusion waveform is usually on the order of 1000 ms·mT/m. Net gradient area larger than 1000 ms·mT/m occurs frequently in restricted diffusion MRI measurements. In a small FOV imaging sequence (e.g., small animal imaging) a large k-space excursion is required to achieve high spatial resolution.

Figure 5:
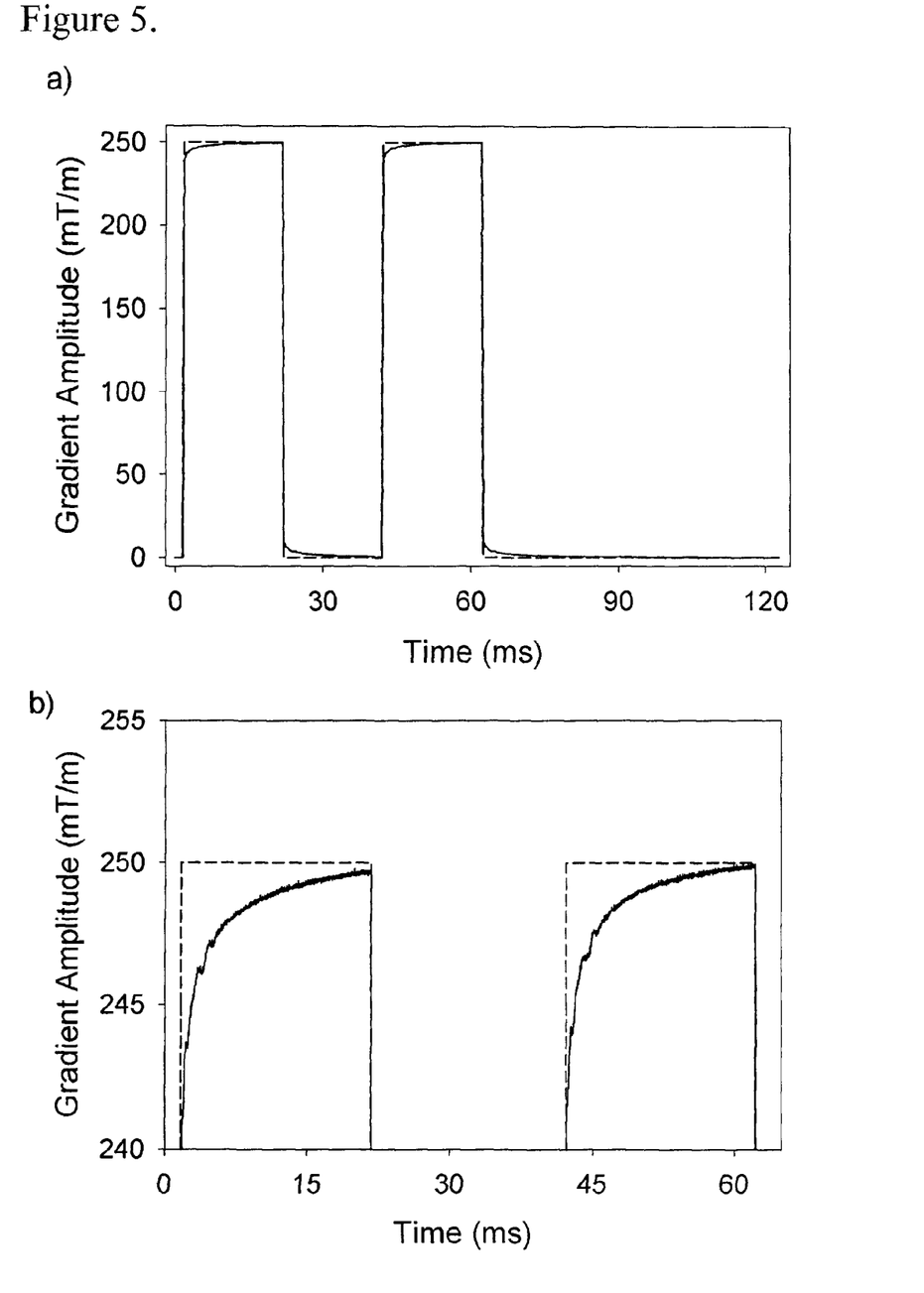
FIG. 5(a) is a graph showing bipolar diffusion gradient waveform measurement with a maximum b value of approximately 100,000 s/mm² for a $G_{max}$ of 250 mT/m.
FIG. 5(b) is a graph showing an expanded portion of the gradient waveform of FIG. 5(a) in the time window 0-60 ms.

As shown in FIG. 5, the pure phase encode method disclosed in this invention can readily measure the gradient waveforms associated with these applications. In FIG. 5($a$), a bipolar diffusion gradient waveform (b value approximately=100,000 s/mm², $G_{max}$=250 mT/m) was measured. Two trapezoidal gradient lobes with a width of 20.25 ms were separated by 40.5 ms. The trapezoidal gradient ramp time was 250 μs. The gradient ramp time is insignificant compared to the natural rise time of the gradient and the trapezoidal gradient shape is not apparent in FIG. 5. The maximal gradient area is as large as 10,000 ms·mT/m. There was a significant difference between the ideal waveform (-) and the measured gradient waveforms (- - -). Note the discrepancies during the stabilization stage and during gradient turnoff.

FIG. 5($b$) shows an expanded portion of the gradient waveform of FIG. 5($a$) in the time window 0-60 ms. This graph shows that the amplitude of second lobe is slightly larger than that of the first lobe. As anticipated, the eddy current induced by the first gradient pulse contributes to the second gradient lobe. Note the measured and ideal waveforms are essentially overlapped during gradient turnoff in FIG. 5($b$). The experimental waveform resolution is 10 μs per point.

Assume for a real diffusion measurement, it was calculated that the net area of the diffusion-weighting gradient waveform after a refocusing RF pulse is 0.2% bigger than the net area before the refocusing pulse. This is equivalent to a spoil gradient with area of 10 ms·mT/m applied after the refocusing pulse and will cause a signal attenuation larger than ideal. This would be sufficient to yield an incorrect diffusion measurement. The subtle oscillations following each gradient switch in FIG. 5($b$) are caused by poor compensation of the amplifier at short time constants.

Since the entire diffusion sensitizing gradient waveform associated with an imaging pulse sequence is measured by this method, different strategies might be envisioned to compensate for the non-ideal gradient behavior/eddy current effect. One strategy is to adjust the gradient waveform, guided by the waveform measurement, to better approximate ideal behavior.

$B_0(t)$ Eddy Current Measurement with MFGM

If $B_e(r, t)$ is the z component of the eddy-current magnetic field that results from pulsing the gradient coils, then a Taylor expansion gives:

$$B_e(r,t) = b_0(t) + r \cdot g(r) \quad (3)$$

The first term is usually called the $B_0$ eddy current. The second term is called the linear eddy current.

In one embodiment of this invention, one MFGM probe is placed at two different locations or an array of two MFGM probes is used with each at a different location to measure $B_{0eddy}(t)$, the $B_0$ eddy current. For MFGM probe samples positioned at location $z_1$ and $z_2$, an offset to the gradient origin along the axis of magnetic field gradient $G_z$, the single point phase for the two cases is:

$$\theta_1 = \gamma G_z(t) z_1 t_p + \gamma B_{0eddy}(t) t_p \quad (4)$$

$$\theta_2 = \gamma G_z(t) z_2 t_p + \gamma B_{0eddy}(t) t_p \quad (5)$$

$B_{0eddy}(t)$ and $G_z(t)$ can thus be solved from the two equations.

In another embodiment, an array of two MFGM probes is used with each at a different location to measure $B_{0eddy}(t)$ and $G_z(t)$ simultaneously.

By analogy, placing one MFGM probe at more than two different locations permits the measurement of $B_{0eddy}(t)$, $G_x(t)$ and $G_y(t)$. Using an array of more than two MFGM probes with each at a different location permits the measurement of $B_{0eddy}(t)$, $G_x(t)$ and $G_y(t)$ simultaneously.

In yet another embodiment of this invention, a multiple FID point method is used to measure $B_0(t)$, $Gx(t)$ and $Gy(t)$. This method can be used to largely increase the SNR of experiments through increasing the phase evolution since the phase evolution i.e, $\gamma B_{0eddy}(t)$ tp caused by B0 eddy current is usually small with a small encoding time tp and the phase discrimination may not be good. A sample with relatively longer relaxation times ($T_1, T_2, T_2^* > 100$ μs) can be used instead. An entire FID should be acquired following each RF excitation. The two equations for two probes at two different locations are:

$$\theta_1(t) = \gamma G_z(t) z_1 t + \gamma B_{0eddy}(t) t \quad (6)$$

$$\theta_2(t) = \gamma G_z(t) z_2 t + \gamma B_{0eddy}(t) t \quad (7)$$

$\theta_1(t)$ is the FID point phase following each RF excitation. A linear least square fitting algorithm can be used to extract $B_{0eddy}(t)$ and $G_z(t)$. This method is well suited for clinical MR applications where lower amplitude gradients (<4 G/cm) are usually employed. Because the FID decay following each RF excitation will be dominated by the short $T_2^*$, not by gradient dephasing, a number of FID points following each RF excitation with a good SNR thus should be used in gradient measurement. This multiple FID point strategy can increase the SNR as well as decrease the scan time. It decreases the number of MFGM probes with a probe array for simultaneously monitoring the gradient waveform and $B_0(t)$ during actual imaging acquisition.

EXPERIMENTS

A spherical bulb micro cell of 3 mm inside diameter and 5 mm outside diameter was employed as the phantom (Wilmad Glass, Buena, N.J.). A heavily $GdCl_3$ doped water solution ($T_2^*, T_2, T_1 = 60 \sim 100$ μs) was carefully syringed into the bulb and the bulb flame sealed.

A single turn solenoidal coil was fabricated by soldering a slotted copper tube (6 mm in O.D, 4 mm in length) with a piece of rigid coaxial cable (6.35 mm in O.D, 33 mm in length) with a Teflon dielectric. The probe and sample are usually wrapped in a copper RF shield. The probe was tuned to 100 MHz and capacitively matched to 50Ω. The probe Q value was 100. The RF amplifier output power was 10 Watts for a 90° pulse length of 5 μs with a deadtime of 12 μs. The minimum phase encode time was thus 12.5 μs.

Gradient waveform measurements were undertaken on a Nalorac (Martinex, Calif.) 2.4 T 32 cm i.d horizontal bore superconducting magnet. The console was a Tecmag (Houston, Tex.) Apollo. A water cooled 7.5 cm i.d. gradient set was employed for gradient waveform measurements. The gradient set was driven by a Techron (Elkhart, Ind.) 8710 amplifier. The RF probe was driven by a 2 kW AMT (Brea, Calif.) 3445 RF amplifier after 23 db attenuation.

For each waveform gradient measurement, the time interval between consecutive RF pulses was 250 μs. The RF pulse duration was 1 μs for a flip angle of 18°. The experimental waveform time resolution was typically 10 μs/point. The phase encoding time was 40 μs with 64 averages normally collected for a total scan time of 5 minutes for the diffusion waveform measurement and 15 minutes for each direction of the conical SPRITE waveform measurement.

REFERENCES

1. M. A. Bernstein, K. F. King, X. J. Zhou, Handbook of MRI pulse sequences, Elsevier Academic press, New York, 2004.
2. F. Schmitt, M. K. Stehling, R. Turner, Echo-planar imaging, Springer-Verlag, Berlin, 1998.
3. W. Block, J. Pauly, A. Kerr, D. Nishimura, Consistent fat suppression with compensated spectral-spatial pulses, Magn. Reson. Med. 38 (1997) 198-206.
4. J. C. Haselgrove, J. R. Moore, Correction for distortion of echo-planar images used to calculate the apparent diffusion coefficient, Magn. Reson. Med. 39 (1997) 960-964.
5. A. Lingamneni, P. A. Hardy, K. A. Powell, N.J. Pelc, R. D. White, Validation of cine phase-contrast MR imaging for motion analysis, J. Magn. Reson. Imaging, 5 (1995) 331-338.
6. G. Mason, T. Harshbarger, H. Hetherington, Y Zhang, G Pohost, D. Twieg, A method to measure arbitrary k-space trajectories for rapid MR imaging. Magn. Reson. Med. 38 (1997) 492-496.
7. Y. T. Zhang, H. P. Hetherington, E. M. Stokely, G. M. Mason, D. B. Twieg, A novel k-space trajectory measurement technique, Magn. Reson. Med. 39 (1998) 999-1004.
8. J. H. Duyn, Y. H Yang, J. A. Frank, Simple correction method of k-space trajectory deviations in MRI, J. Magn. Reson. 132 (1998) 150-153.
9. D. H Kim, D. M Spielman, Reducing gradient imperfections for spiral magnetic resonance spectroscopic imaging, Magn. Reson. Med. 56 (2006) 198-203.
10. P. Latta, M. L. Gruwel, V. Volotovskyy, M. H. Weber, B. Tomanek, Simple phase method for measurement of magnetic field gradient waveforms, Magn. Reson. Imaging. 25 (2007) 1272-1276.
11. V. Jellus, J. C. Sharp, B. Tomanek, P. Latta, An NMR technique for measurement of magnetic field gradient waveforms, J. Magn. Reson. 162 (2003) 189-197.
12. A. Takahashi, T. Peters, Compensation of multi-dimensional selective excitation pulses using measured k-space trajectories. Magn. Reson. Med. 34 (1995) 446-456.
13. M. T. Alley, G. H. Glover, N. J. Pelc, Gradient characterization using a Fourier-transform technique. Magn. Reson. Med. 39 (1998) 581-587.
14. N. Papadakis, A. A. Wilkinson, T. A. Carpenter, L. D. Hall, A general method for measurement of the time integral of variant magnetic field gradients: application to 2D spiral imaging. Magn. Reson. Imaging. 15 (1997) 567-578.
15. N. De Zanche, C. Barmet, J. A. Nordmeyer-Massner, K. P. Pruessmann, NMR probes for measuring magnetic fields and field dynamics in MR systems, Magn. Reson. Med. 60 (2008) 176-186.
16. C. Barmet, N. De Zanche, K. P. Pruessmann, Spatiotemporal magnetic field monitoring for MR, Magn. Reson. Med. 60 (2008) 187-197.
17. D. J. Goodyear, M. Shea, S. D. Beyea, N. J. Shah, B. J. Balcom, Single point measurements of magnetic field gradient waveform, J. Magn. Reson. 163 (2003) 1-7.
18. D. I. Hoult, R. E. Richards, The signal-to-noise ratio of the nuclear magnetic resonance experiment, J. Magn. Reson. 24 (1976) 71-85.
19. D. I. Hoult, The principle of reciprocity in signal strength calculations—a mathematical guide, Concepts. Magn. Reson. 12 (2000) 173-187.
20. J. Mispelter, M. Lupu, A. Briquet, NMR probeheads for biophysical and biomedical experiments theoretical principles & practical guidelines, Imperial College press, London, 2006.
21. T. L. Peck, R. L. Magin, P. C. Lauterbur, Design and analysis of microcoils for NMR microscopy, J. Magn. Reson. 34 (1979) 425-433.
22. M. Halse, D. J. Goodyear, B. MacMillan, P. Szomolanyi, D. Matheson, B. J. Balcom, Centric scan SPRITE magnetic resonance imaging, J. Magn. Reson. 165 (2003) 219-229.
23. P. Jezzard, A. S. Barnett, C. Pierpaoli, Characterization of and correction for eddy current artifacts in echo planar diffusion imaging, Magn. Reson. Med. 39 (1998) 801-812.
24. T. G. Reese, O. Heid, R. M. Weisskoff, V. J. Wedeen, Reduction of eddy-current-induced distortion in diffusion MRI using a twice-refocused spin echo, Magn. Reson. Med. 49 (2003) 177-182.

What is claimed is:

1. A method of making a measurement of a magnetic field gradient within a local area of a magnetic field gradient in an NMR sample space, comprising the steps of:
   (a) providing a reference sample in the local area;
   (b) providing an RF probe suitable for holding the reference sample;
   (c) exciting the reference sample by a broad band RF pulse;
   (d) following the RF excitation, acquiring a free induction decay (FID) from the reference sample after a fixed duration phase encoding time;
   (e) determining the phase for the measurement in the fixed duration phase encoding time; and
   (f) determining the magnetic field gradient from the phase.

2. The method of claim 1, wherein acquiring the FID comprises acquiring a single FID point or a cluster of individual FID points after the RF pulse, as the underlying magnetic field gradient changes in time.

3. The method of claim 2, wherein the reference sample comprises doped water.

4. The method of claim 3, wherein the water is doped with an MR contrast agent.

5. The method of claim 4, wherein the contrast agent is gadolinium chloride ($GdCl_3$).

6. The method of claim 1, wherein the RF probe comprises a single turn solenoid.

7. The method of claim 1, wherein the RF probe comprises a multiple turn solenoid.

8. The method of claim 1, wherein the RF pulses are low flip angle RF pulses, whereby RF pulses prior to the gradient pulse provide a reference phase.

9. The method of claim 1 wherein the RF probe is of a sufficiently small size relative to the sample space to permit placement of the probe at various locations within the sample space to enable measurement with the RF probe at various locations within the sample space.

10. The method of claim 1, further comprising one or more additional RF probes of a sufficiently small size relative to the sample space to permit placement of the RF probes at various locations within the sample space to enable measurement with the RF probes at various locations within the sample space.

11. The method of claim 1, wherein the RF probe comprises materials that are not magnetic susceptibility matched to the surroundings of the sample space.

12. The method of claim 1, further comprising: repeating steps (c) to (f) while shifting the position in time of each subsequent pulse whereby a plurality of time points on the gradient waveform are acquired.

13. The method of claim 9, further comprising providing an RF probe adapted for a magnetic resonance measurement, wherein the sample space is contained within the RF probe adapted for a magnetic resonance measurement.

14. The method of claim 9, further comprising:
   placing the probe at two locations in the sample space;
   taking a single point pure phase encode measurement at each of the locations;
   determining the phase for each of the measurements;
   determining a magnetic shift $B_o(t)$ comprising determining the difference in phase between the two measurements.

* * * * *